United States Patent
Hom

(10) Patent No.: US 12,055,596 B2
(45) Date of Patent: Aug. 6, 2024

(54) REAL-TIME BATTERY FAULT DETECTION AND STATE-OF-HEALTH MONITORING

(71) Applicant: Wisk Aero LLC, Mountain View, CA (US)

(72) Inventor: Lewis Romeo Hom, Mountain View, CA (US)

(73) Assignee: Wisk Aero LLC, Mountain View, CA (US)

(*) Notice: Subject to any disclaimer, the term of this patent is extended or adjusted under 35 U.S.C. 154(b) by 0 days.

(21) Appl. No.: 17/933,357

(22) Filed: Sep. 19, 2022

(65) Prior Publication Data

US 2023/0023729 A1   Jan. 26, 2023

Related U.S. Application Data

(63) Continuation of application No. 17/196,848, filed on Mar. 9, 2021, now Pat. No. 11,480,625.

(Continued)

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/3842* (2019.01); *H02J 7/005* (2020.01)

(58) Field of Classification Search
CPC ............... G01R 31/392; G01R 31/367; G01R 31/3842; G01R 31/374; G01R 31/3646;
(Continued)

(56) References Cited

U.S. PATENT DOCUMENTS 6,307,377 B1   10/2001   Cummings et al.
9,293,937 B2   3/2016   Kawahara et al.
(Continued)

FOREIGN PATENT DOCUMENTS

CA   2788893 A1 *   3/2013   ......... G01R 31/3679
CN   103091636 A   5/2013
(Continued)

OTHER PUBLICATIONS

WO-2016192961-A1_translated (Year: 2016).*
(Continued)

*Primary Examiner* — Manish S Shah
*Assistant Examiner* — Michael J Singletary
(74) *Attorney, Agent, or Firm* — Kilpatrick Townsend & Stockton LLP

(57) ABSTRACT

Battery management systems and methods can provide real-time automated monitoring of various aspects of battery health and operation. Some battery management systems can use an equivalent cell circuit model to predict a range for the expected behavior of a battery cell under actual operating conditions in real-time. The prediction can be compared to the actual behavior of the cell to determine whether an anomaly exists. Some battery management systems can maintain an estimate of battery state-of-health parameters such as charge capacity and internal resistance and can update these estimates in real time while the battery is being discharged and/or charged. Anomalous variations in a monitored parameter can trigger a real-time fault notification.

14 Claims, 8 Drawing Sheets

Related U.S. Application Data

(60) Provisional application No. 62/988,853, filed on Mar. 12, 2020.

(51) Int. Cl.
  *G01R 31/3842* (2019.01)
  *H02J 7/00* (2006.01)

(58) Field of Classification Search
  CPC .... G01R 31/3648; H02J 7/005; H02J 7/0071; H02J 7/0048; B60R 16/033; G08B 21/182; G08B 21/185; H01M 10/052; H01M 10/486; Y02E 60/10; Y02T 10/70
  See application file for complete search history.

(56) References Cited

U.S. PATENT DOCUMENTS

| | | |
|---|---|---|
| 2005/0156570 A1 | 7/2005 | Inui et al. |
| 2006/0022644 A1 | 2/2006 | Sakurai et al. |
| 2007/0285061 A1* | 12/2007 | Zettel .................. G01R 31/392 320/132 |
| 2008/0238371 A1 | 10/2008 | Tamezane |
| 2013/0311119 A1 | 11/2013 | Tamezane |
| 2015/0044515 A1 | 2/2015 | Camp et al. |
| 2016/0049821 A1 | 2/2016 | Aridome |
| 2018/0290544 A1 | 10/2018 | Long |
| 2019/0260216 A1 | 8/2019 | Hom et al. |
| 2020/0036195 A1 | 1/2020 | Furman et al. |
| 2020/0412146 A1 | 12/2020 | Takechi |

FOREIGN PATENT DOCUMENTS

| | | |
|---|---|---|
| CN | 104852413 A | 8/2015 |
| CN | 105050855 A | 11/2015 |
| CN | 106842065 A | 6/2017 |
| CN | 109795363 A | 5/2019 |
| CN | 111025168 A | 4/2020 |
| EP | 1777794 A2 | 4/2007 |
| EP | 3026752 A1 | 6/2016 |
| EP | 3993212 A1 | 5/2022 |
| JP | 2013096752 A | 5/2013 |
| JP | 2014185896 A | 10/2014 |
| JP | 2018048910 A | 3/2018 |
| JP | 2018159572 A | 10/2018 |
| JP | 2020120555 A | 8/2020 |
| WO | 2004053510 A1 | 6/2004 |
| WO | 2012105492 A1 | 8/2012 |
| WO | 2012143996 A1 | 10/2012 |
| WO | 2013109940 A2 | 7/2013 |
| WO | WO-2016192961 A1 * | 12/2016 .............. B60L 58/10 |
| WO | 2017142585 A1 | 8/2017 |
| WO | 2019187307 A1 | 10/2019 |
| WO | WO-2020097271 A1 * | 5/2020 ........... G01R 31/392 |

OTHER PUBLICATIONS

WO-2020097271-A1_translated (Year: 2020).*
CA-2788893-A1_translated (Year: 2013).*
CN202180020127.8 , "Office Action", Apr. 20, 2023, 21 pages (translation).
KR10-2022-7035547 , "Office Action", Apr. 13, 2023, 3 pages (translation).
CA3169651 , "Office Action", Feb. 21, 2023, 4 pages.
JP2022-549359 , "Office Action", Jan. 20, 2023, 9 pages (English Translation).
PCT/US2021/021709 , "International Search Report and Written Opinion", Jul. 28, 2021, 15 pages.
EP21768142.8 , "Extended European Search Report", Jan. 16, 2024, 7 pages.
KR10-2022-7035547 , "Notice of Decision Grant", Feb. 16, 2024, 8 pages (translation).
CN202180020127.8 , "Office Action", Nov. 4, 2023, 7 pages (translated).

* cited by examiner

REAL-TIME BATTERY FAULT DETECTION AND STATE-OF-HEALTH MONITORING

CROSS-REFERENCE TO RELATED APPLICATIONS

This application is a continuation of U.S. application Ser. No. 17/196,848, filed Mar. 9, 2021, which claims priority to U.S. Provisional Application No. 62/988,853, filed Mar. 12, 2020. The disclosures of both applications are incorporated herein by reference.

TECHNICAL FIELD

The present disclosure relates generally to battery monitoring and in particular to systems and methods for real-time monitoring of battery health and performance.

BACKGROUND

A battery is an electrochemical device that can convert stored chemical energy to electrical energy. Numerous examples of battery technologies are known in the art, including lithium ion batteries, nickel-metal-hydride batteries, lead-acid batteries, nickel-cadmium batteries, alkaline batteries, and so on. Batteries can be made in many sizes and with a range of operating characteristics (e.g., voltage (or electrical potential), maximum current, charge capacity, and so on). To support high voltage or high charge capacity, battery packs can be made by electrically connecting multiple battery cells in series and/or in parallel. Depending on the technology, some types of batteries can be rechargeable by connecting to a source of charging current.

Batteries (particularly lithium-ion batteries) have found a wide variety of uses, including as a portable power source to drive the motors of vehicles such as cars, aircraft, watercraft, and so on. In some cases, a battery or battery pack may be the sole power source for a vehicle. A vehicle that relies solely on battery power for propulsion may abruptly lose its motive power if the battery fails. Depending on the state of the vehicle when a battery failure occurs, the consequences can range from inconvenient to disastrous. Accordingly, it may be desirable to monitor battery performance and detect conditions that may indicate problems, so that the battery can be serviced or replaced before it fails.

SUMMARY

Described herein are examples (or embodiments) of battery monitoring systems and methods that can provide real-time automated monitoring of various aspects of battery health and operation. In various embodiments, different aspects of battery health and operation can be monitored. For example, a battery monitoring system can use an equivalent cell circuit model to predict a range (or "envelope") defining expected behavior of a battery cell (e.g., electrical potential or voltage of the cell) under actual operating conditions (e.g., a particular load current or charging current at a particular temperature) in real-time. The prediction can be compared to the actual behavior of the cell (e.g., a measured potential of the cell) to determine whether a potential problem, referred to herein as a "model fault" condition, exists. As another example, a battery monitoring system can maintain an estimate of battery state-of-health parameters such as charge capacity and internal resistance; these estimates can be updated in real time while the battery is being discharged and/or charged, and anomalous variations in the state-of-health parameters can indicate a "suspicious parameter" fault. The battery monitoring system can provide notifications of detected faults in real time, allowing prompt corrective action to be taken.

According to some embodiments, a method for monitoring charge capacity of a battery cell can include: while the battery cell is in an idle state, determining an initial state of charge of the battery cell; thereafter monitoring a total amount of charge transferred from or to the battery cell while the battery cell is an active state (e.g., a discharging state in which charge is transferred from the battery cell to a load, or a charging state in which charge is transferred from an external power source to the battery cell); after the battery cell returns to the idle state, determining a final state of charge of the battery cell; computing an unfiltered charge capacity value using the initial state of charge, the final state of charge, and the total amount of charge transferred; and updating a charge capacity estimate using the unfiltered charge capacity value.

In some embodiments, a magnitude of change in the charge capacity estimate relative to a previous estimate can be computed, and a cell capacity fault notification can be generated in the event that the magnitude of change in the charge capacity exceeds a threshold value.

In some embodiments, determining the initial state of charge can include: measuring an initial cell potential and an initial cell temperature of the battery cell while the battery cell is in the initial idle state; and computing a state of charge for the battery cell based on an equivalent cell circuit model using the initial cell potential and the initial cell temperature.

In some embodiments, determining the final state of charge can include: measuring a final cell potential and a final cell temperature of the battery cell when the battery cell returns to the idle state; and computing a state of charge for the battery cell based on the equivalent cell circuit model using the final cell potential and the final cell temperature.

In some embodiments, monitoring the total amount of charge transferred while the battery cell is in the active state can include: measuring a current through the battery cell at regular time intervals; and adding a product of the measured current and a time step defined by the regular time intervals to a running total of charge transferred.

In some embodiments, updating the charge capacity estimate can include applying an infinite impulse response filter to the unfiltered charge capacity value and a previously stored charge capacity estimate.

According to some embodiments, a method for monitoring internal resistance of a battery cell can include: in response to detecting a transition of the battery cell from an idle state to an active state (which can be, e.g., a charging state or a discharging state), initializing a running estimate of an internal resistance using a stored value; while the battery cell is in the active state: measuring a potential, a current, and a temperature of the battery cell; and iteratively updating the running estimate of the internal resistance based on the measured potential, current, and temperature; and in response to detecting a transition of the battery cell from the active state to the idle state: calculating a change in internal resistance based on the stored value and a final value of the running estimate; and updating the stored value using the final value of the running estimate.

In some embodiments, a cell resistance fault notification can be generated in the event that the change in internal resistance exceeds a threshold value.

In some embodiments, iteratively updating the running estimate of the internal resistance based on the measured potential, current, and temperature can include determining, for each iterative update, whether the measured potential, current, and temperature are within predefined valid ranges. In the event that the measured potential, current, and temperature are within the predefined valid ranges, a raw estimate of the internal resistance can be computed based on an equivalent cell circuit model, and the running estimate can be updated using the raw estimate and a previous running estimate from a preceding time step. In some embodiments, the raw estimate is compared to a plausible range of values and is used to update the running estimate only if the raw estimate is within the plausible range of values. In the event that one or more of the measured potential, current, or temperature is not within the predefined valid ranges, the method can include waiting for the next time step without updating the running estimate.

In some embodiments, updating the running estimate can include applying an infinite impulse response filter to the raw estimate and the previous running estimate.

According to some embodiments, a method for monitoring status of a battery cell can include: determining current values of one or more state-of-health parameters of the battery cell (e.g., internal resistance of the battery cell, charge capacity of the battery cell); measuring values of a plurality of operating-state parameters of the battery cell (e.g., current through the battery cell, temperature of the battery cell), including measuring an actual potential of the battery cell; computing an optimistic potential based on a cell state model (e.g., an equivalent cell circuit model), the measured values of a first subset of the operating-state parameters, and optimistic values for the one or more state-of-health parameters, the optimistic values corresponding to a better state of health than the current values of the one or more state-of-health parameters; computing a pessimistic potential based on the cell state model, the measured values of the first subset of operating-state parameters, and pessimistic values for the one or more state-of-health parameters, the pessimistic values corresponding to a worse state of health than the current values of the one or more state-of-health parameters; determining whether the actual potential of the battery cell is substantially within an envelope defined by the optimistic potential and the pessimistic potential; and generating a model fault notification in the event that the actual potential is not substantially within the envelope. In various embodiments, the method can be performed in real time while the battery cell is powering a load and/or while the battery cell is charging. Model fault notifications can be generated in real time while the battery is in active use (powering a load and/or charging). In some embodiments, a predicted potential of the battery cell can also be computed based on a cell state model, the measured values of a first subset of the operating-state parameters, and the current values of the one or more state-of-health parameters.

In some embodiments, estimates of charge capacity and/or internal resistance of the battery cell can be determined while the battery is in active use according to techniques described herein, and these estimates can be used in the status-monitoring method.

Any or all of the above or other methods, or any combination thereof, can be implemented in a real-time battery monitoring system (using hardware, software/firmware, or any combination thereof) that can operate regardless of whether the battery is in active use, including while the battery is powering a load and/or while the battery is charging. In some embodiments, the battery monitoring system may generate alerts or perform other actions based on to the results of any of the above or other methods.

The following detailed description, together with the accompanying drawings, will provide a better understanding of the nature and advantages of the claimed invention.

DETAILED DESCRIPTION

The following description of exemplary embodiments of the invention is presented for the purpose of illustration and description. It is not intended to be exhaustive or to limit the claimed invention to the precise form described, and persons skilled in the art will appreciate that many modifications and variations are possible. The embodiments have been chosen and described in order to best explain the principles of the invention and its practical applications to thereby enable others skilled in the art to best utilize the invention in various embodiments and with various modifications as are suited to the particular use contemplated.

System Overview

Figure 1:
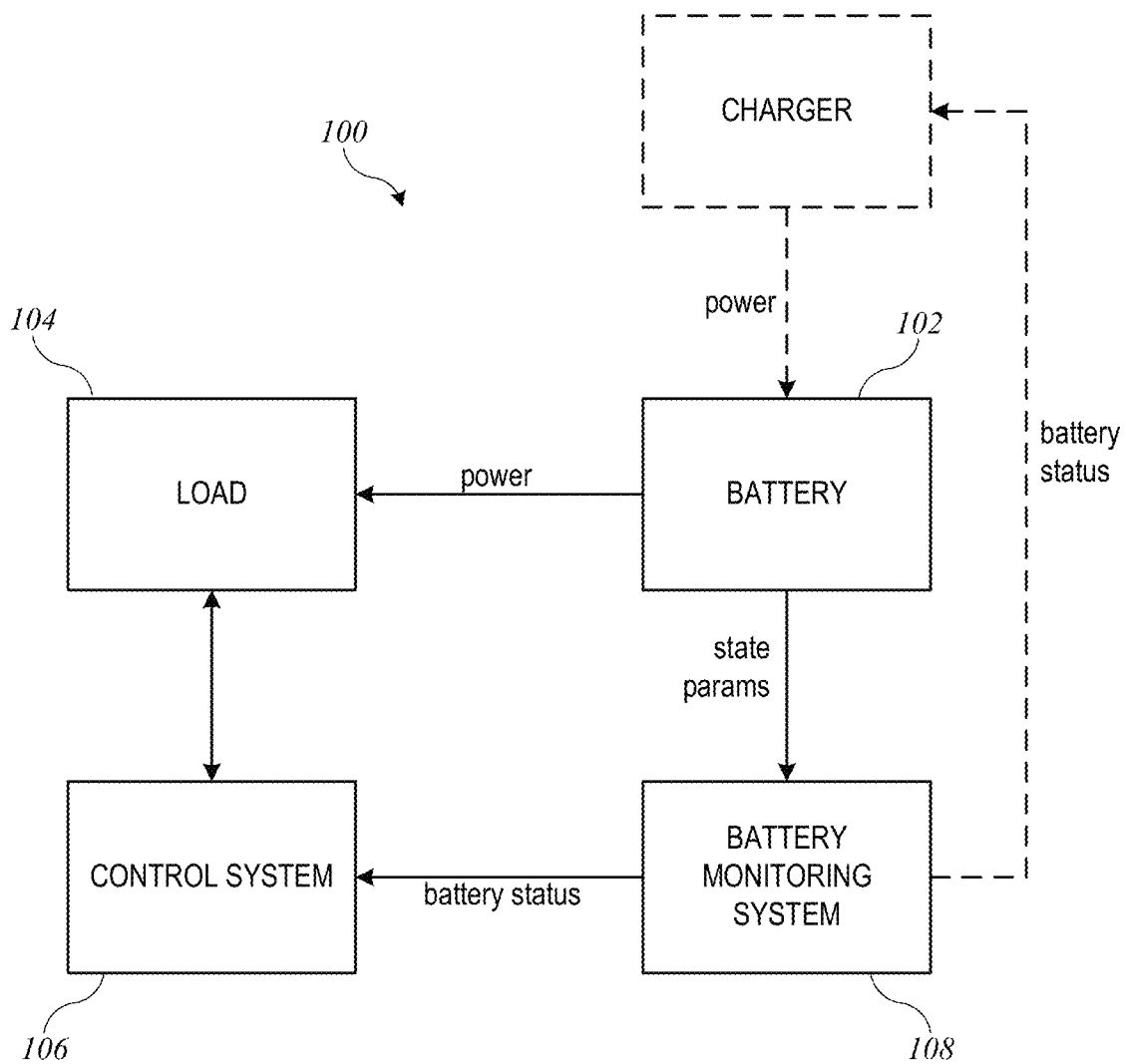
FIG. 1 shows a high-level block diagram of an operating environment for battery monitoring according to some embodiments.

FIG. 1 shows a high-level block diagram of an operating environment 100 for battery monitoring according to some embodiments. Environment 100 can be, for example a powered vehicle such as an aircraft, watercraft, rail vehicle, car, truck, off-road vehicle, or the like. Environment 100 includes a battery 102 that provides power to an electrical load 104. Battery 102 can be any type of battery, including a lithium ion battery, lead-acid battery, nickel-metal-hydride battery, and so on. Battery 102 can be implemented as a single battery cell or as a battery pack that includes multiple battery cells connected together in series and/or in parallel as desired. (As used herein, the term "battery cell" or "cell" can be understood as including a standalone battery or, in the case of a battery pack, one of some number of independently replaceable battery units within the battery pack.) Electrical load 104 can include, for example, a motor (or engine) of the vehicle, or any other battery-powered mechanism or device. Electrical load 104 can draw varying amounts of power from battery 102 at different times. For example, a motor of a vehicle may draw more power when the vehicle is accelerating than when the vehicle is at rest or moving at a constant speed.

A control system 106 communicates with load 104. For instance, control system 106 can send instructions to load 104, e.g., to increase or decrease motor speed, or to enable, disable, or change operating state of any power-consuming component. Control system 106 can also receive feedback from load 104 indicating its operating state, anomalous conditions that may occur, and the like. Control system 106 can also include human interface components, such as display screens, indicator lights, speakers, human-manipulable control devices (e.g., keyboard, mouse, touch screen or touch pad, joystick, control wheel, foot pedal, and so on). Control system 106 can be local to load 104 (e.g., in a vehicle of which load 104 includes the motor), or located remotely from load 104 and communicating via an appropriate connection, including short-range or long-range network connections. In some embodiments, control system 106 can include both local and remote elements. For instance, environment 100 can be an autonomous or remotely-piloted vehicle that is monitored and directed from a location other than where it operates.

In some embodiments, battery 102 is a rechargeable battery that can be recharged by connecting battery 102 to a source of charging power, such as charger 110. Charger 110 can include any system or device that is capable of providing power (or charge) from an external source (e.g., standard wall power or any other power source external to battery 102) to be stored by battery 102; numerous examples are known in the art. Charger 110 can also include control circuitry to control the operation of charger 110, including when and how much power to supply. In some embodiments, battery 102 can be coupled to charger 110 at certain times and decoupled from charger 110 at other times; hence, charger 110 is shown using broken lines. Depending on implementation, battery 102 may or may not be able to provide power to load 104 while receiving power from charger 110. In some embodiments, control system 106 can coordinate the operation of charger 110 with load-powering operation of battery 102.

Battery monitoring system 108 can be coupled to battery 102, to control system 106, and to charger 110. Battery 102 can be outfitted with sensors to measure various state parameters of the battery or individual cells, such as potential, current (which can flow in either direction, depending on whether the battery is being charged or discharged), and operating temperature. Battery monitoring system 108 can receive the measured state parameters from battery 102 in real time (e.g., while load 104 is drawing power from battery 102). Based on the state parameters, battery monitoring system 108 can perform various computations to determine values of state-of-health parameters (e.g., charge capacity and/or internal resistance) for the battery or for individual cells and/or to detect whether battery performance is consistent with expected behavior. Examples of computations that can be implemented in battery monitoring system 108 are described below. Based on the results of the computations, battery monitoring system 108 can provide battery status information to control system 106 and/or charger 110. The battery status information can include, for instance, any combination of measured state parameters reported from battery 102, values of the state-of-health parameters computed by battery monitoring system 108, information comparing actual battery behavior to a model of expected battery behavior, "fault" notifications indicating that some aspect of battery performance has deviated from expectations, and/or any other information that may be available in battery monitoring system 108. Control system 106 and/or charger 110 can use this information to generate alerts to an operator of environment 100, to change the operation of load 104 based on the battery status information, to change the operation of charger 110 (e.g., the rate at which charging power is supplied to battery 102) based on the battery status information, to maintain battery history information for battery 102, and/or to take other responsive action that may be programmed into control system 106.

In one specific example, operating environment 100 corresponds to a battery-powered aircraft that is capable of flying under local or remote control. Load 104 can include the motor of the aircraft, and battery 102 can be the power source for the motor. In such an environment, reliability of battery 102 is critical for enabling the aircraft to safely complete a flight. To provide the necessary amount of power with high reliability, battery 102 can include a high-voltage battery bank made up of multiple battery packs arranged in parallel (which can provide redundancy), with each battery pack incorporating multiple cells arranged in series and/or in parallel. Battery monitoring system 108 can provide real-time information about the status of each battery pack, e.g., on a per-cell basis or for groups of cells, allowing problems to be detected and addressed before battery failure occurs. For instance, when battery monitoring system 108 generates a notification of a fault, a service technician can be notified, and battery 102 can be repaired or replaced before the next flight. In this example, battery 102 can be coupled to charger 110 for recharging between flights, and battery monitoring system 108 can continue to provide information about the status of each battery pack during charging.

It should be understood that operating environment 100 is illustrative and not limiting. Any type of battery (including any number and arrangement of battery cells) driving any type of load may be monitored using systems and methods of the kind described herein.

Figure 2:
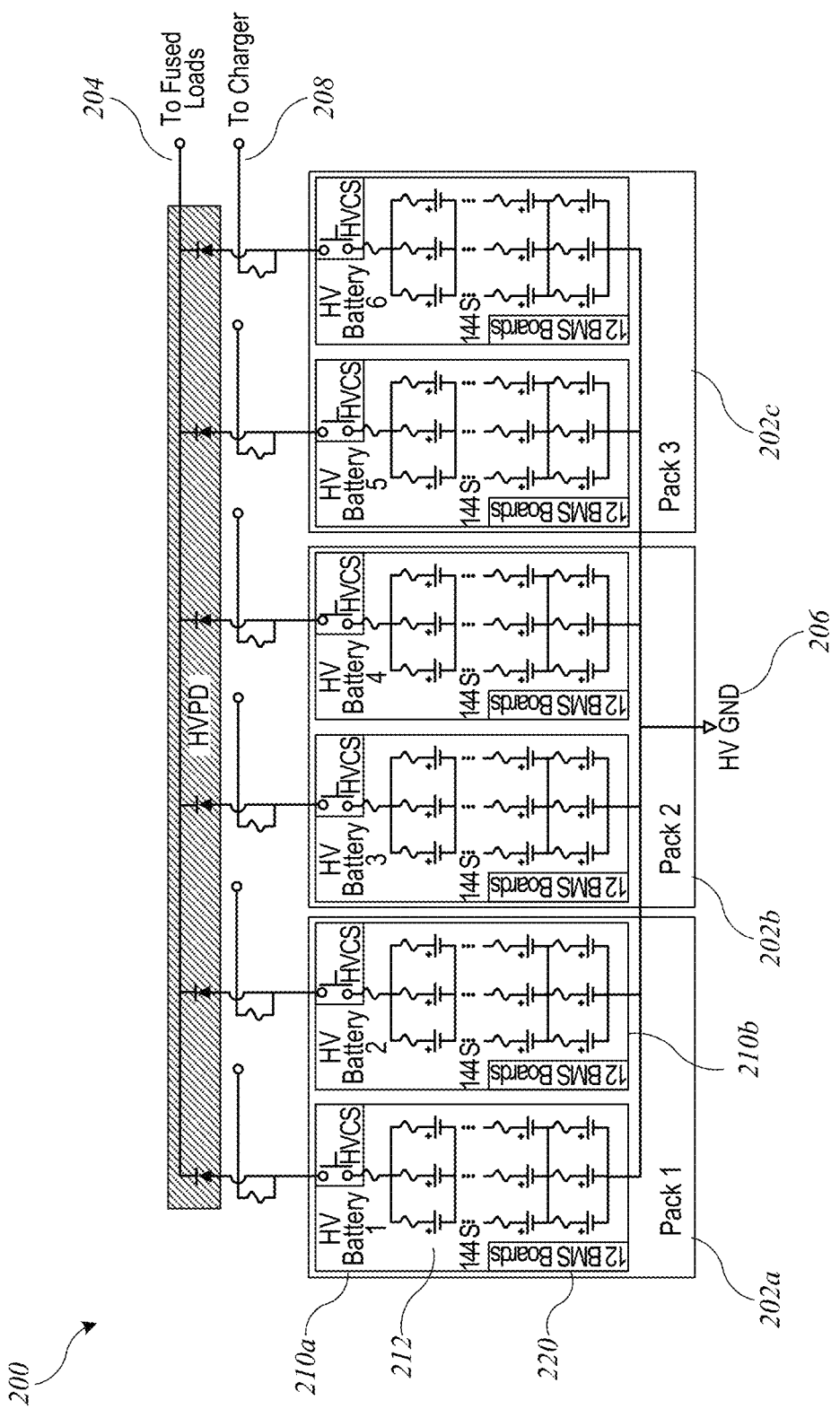
FIG. 2 shows a simplified schematic diagram of a battery bank according to some embodiments.

FIG. 2 shows a simplified schematic diagram of a battery bank 200 according to some embodiments. Battery bank 200 incorporates a battery monitoring system as an embedded system within the battery bank. Battery bank 200 can be used as battery 102 in an operating environment such as operating environment 100 described above. In this example, battery bank 200 includes three high-voltage (HV) battery packs 202*a-c* connected in parallel between terminal 204 (which can connect to a load) and ground 206. Battery packs 202*a-c* are rechargeable, and charging terminals 208 are provided for connecting each battery pack 202*a-c* to a charger.

Each of battery packs 202*a-c* includes two HV batteries 210*a-b* connected in parallel. Each HV battery 210*a-b* includes individual battery cells 212, which can be, e.g., lithium ion cells. For example, each cell may have an operating voltage of 3-5 V, internal resistance of 1-50 mΩ, operating current range of 0-200 mA; these parameters can be varied. The number of cells 212 can be quite large. In this example, battery cells 212 within each HV battery 210*a-b* are connected in series to form strings having a large number of cells 212 (e.g., 144 cells per string), and three series strings are connected together in parallel within each HV battery 210*a-b*. Battery bank 200 can provide both a high operating voltage (e.g., overall system voltage in a range from about 400 to 800 V) and a high level of redundancy, such that battery bank 200 can continue to supply power even if some of cells 212 fail.

Each HV battery 210 also includes battery monitoring system (BMS) boards 220, which can be components of battery monitoring system 108 of FIG. 1. Each BMS board 220 can be a printed circuit board with circuitry configured to monitor the status of one or more cells within the HV battery 210. In some embodiments, BMS boards 220 are capable of monitoring every cell of each HV battery 210. For instance, each HV battery 210 can include 12 BMS boards 220, with each BMS board capable of monitoring 36 cells. Examples of components and operations that can be implemented in BMS boards 220 are described below.

It should be understood that battery bank 200 is illustrative and not limiting. A battery system can include any number of batteries, and each battery can include any number of cells Battery monitoring as described herein can be performed at the level of individual cells, or a group of cells can be monitored as a unit if desired.

Figure 3:
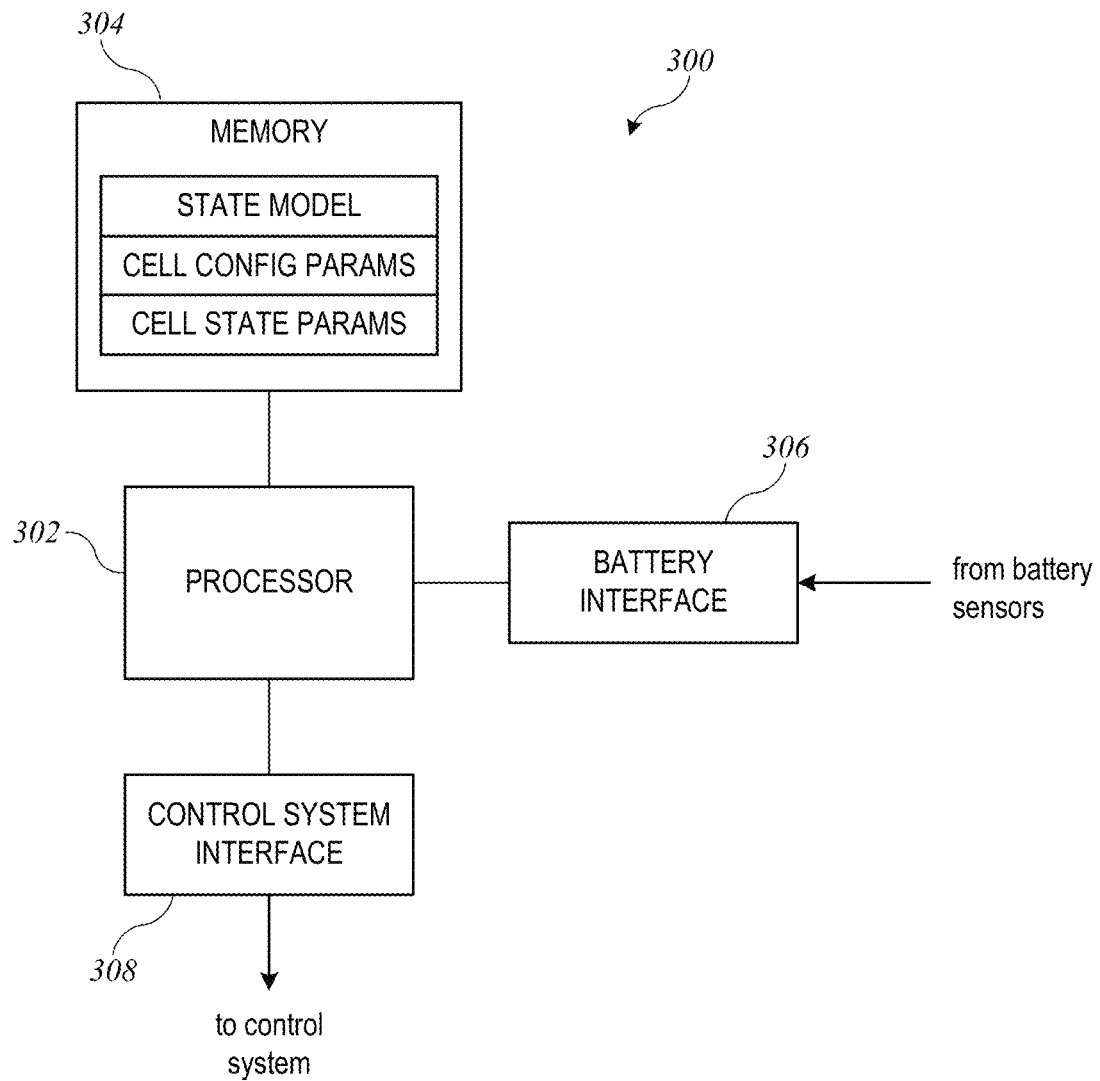
FIG. 3 shows an example of a battery monitoring system according to some embodiments.

FIG. 3 shows an example of a battery monitoring system 300 according to some embodiments. Battery monitoring system 300 can be used, for instance, to implement battery monitoring system 108 of FIG. 1. In some embodiments, each BMS board 220 of battery bank 200 of FIG. 2 can include one or more instances of the components of battery monitoring system 300.

Battery monitoring system 300 includes a processor 302, memory 304, battery interface 306, and control system interface 308. Processor 302 can be a microprocessor, microcontroller, application specific integrated circuit (ASIC), field programmable gate array (FPGA), or other circuit implementing logic operations as described herein. In some embodiments, battery monitoring system 300 can be an embedded system, and as described below, computations can be implemented in a manner that can be performed in real time using a small, low-power processor. Memory 304 can include semiconductor-based memory (e.g., DRAM, SRAM), flash memory, magnetic storage, optical storage, or other computer-readable storage media. Memory 304 can store information about each battery cell that battery monitoring system 300 monitors. For instance, memory 304 can store cell configuration parameters 310 and cell state parameters 312. Cell configuration parameters 310 can include parameters that are static or slowly varying across the life of a particular cell, while cell state parameters 312 can include parameters that vary dynamically as the battery is used. Memory 304 can also store a cell state model (e.g., an equivalent cell circuit model) that can be used to predict state parameters of a cell in an iterative manner. For instance, the cell state model can predict the state of charge and state of polarization (or voltage) of a cell at a given time step based on the current drawn, temperature, internal resistance, charge capacity, and state of charge at a previous time step. In some embodiments, the same cell state model is applied to all cells, but predictions for different cells may differ due to differences between cells with respect to configuration and/or state parameter values. As another example, a cell state model can be used to estimate cell configuration parameters that may evolve over time, such as charge capacity and internal resistance. Specific examples are described below.

Battery interface 306 can include hardware and/or software components that enable processor 302 to obtain state information from a sensors of a cell (or battery) connected to battery interface 306. The state information can include, e.g., measurements of current, potential, and operating temperature of the cell. In some embodiments, battery interface 306 provides state information at regular time intervals. If desired, the interval can be varied depending on the current operating mode. For instance, state information can be provided once or twice per second while the battery is in active use, or three or four times an hour when the battery is idle. In some embodiments, battery interface 306 can send requests for state information to the battery at the desired interval. Alternatively, the battery cells may have sensors that continually provide data (e.g., as analog signals), and battery interface 306 can sample and digitize the analog signals at appropriate times. Processor 302 can use sensor data thus obtained to compute various state parameter values, e.g., as described below.

Control system interface 308 can include hardware and/or software components that enable processor 302 to provide battery status information to a control system (e.g., control system 106 of FIG. 1). In various embodiments, the battery status information can include data received from the battery cells, state parameters computed from the data, configuration parameters computed from the data, and/or fault notifications or other alerts, examples of which are described below.

It should be understood that battery monitoring system 300 is illustrative and that variations and modifications are possible. In some embodiments, battery monitoring system 300 can include a separate instance of its components for each cell that is being monitored, or multiple cells may be monitored using a single processor with associated memory device(s). In examples described herein, battery monitoring is performed for a cell; however, battery monitoring at a higher level (e.g., a group of serially connected cells or an entire battery pack or battery bank) is not precluded. Battery monitoring system 300 can implement any number and combination of monitoring operations, including but not limited to any one or more of the examples described below. In some embodiments, a battery monitoring system can also support other battery management operations such as calibration, self-testing, and so on.

In operation, a battery monitoring system such as battery monitoring system 300 can monitor battery state and evaluate battery status in real time to determine whether the battery (or a particular cell) is performing as expected, taking into account natural aging of battery cells (which may slowly degrade performance) and other considerations affecting battery performance. Examples of battery monitoring processes will now be described.

Model Fault Detection

One type of battery monitoring process can be based on predicting and observing battery cell behavior during normal use. Battery cells are generally electrochemical in nature, and the response of a cell to specific conditions, e.g., potential as a function of current or current at a given operating potential, can be quantitatively modeled using an equivalent cell circuit model or the like. Accordingly, some embodiments of a battery monitoring system can use prediction functions derived from a quantitative model (referred to herein as a "cell state model") of the cell being monitored to predict cell potential at any given time during battery operation. The actual (measured) cell potential can be compared to the prediction, and a "model fault" notification can be generated if the actual cell potential is inconsistent with the prediction.

Figure 4:
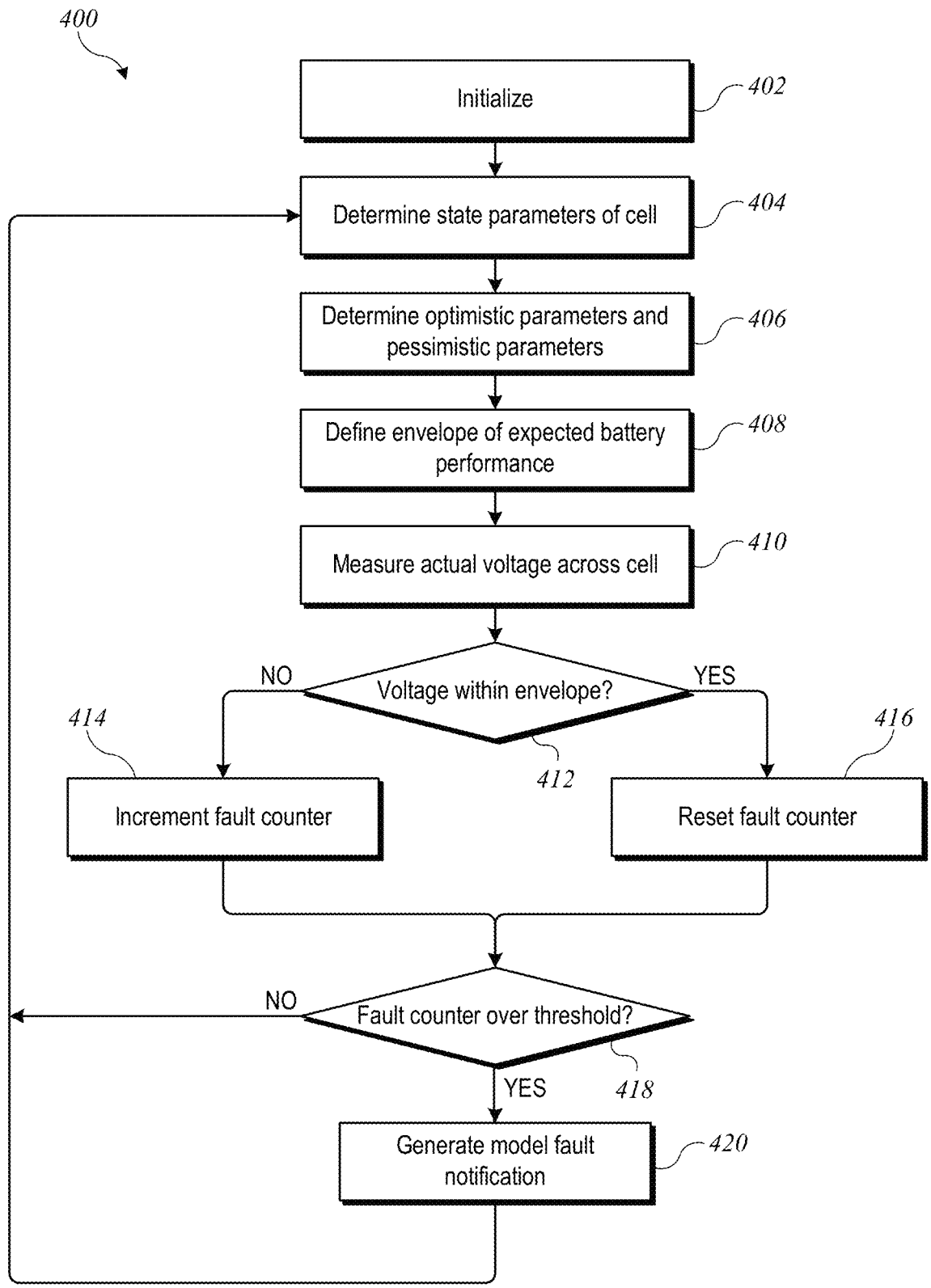
FIG. 4 is a flow diagram of a process for modeling cell behavior and detecting model faults according to some embodiments.

FIG. 4 is a flow diagram of a process 400 for modeling cell behavior and detecting model faults according to some embodiments. Process 400 can be implemented, e.g., in battery monitoring system 300 or other battery monitoring systems described above. Process 400 can operate in real time to monitor the state of a cell and determine whether the cell state is consistent with predictions of a cell state model. In some embodiments, process 400 maintains a an estimated (or predicted) cell state for each cell that is dynamically updated at regular time intervals based on measurement data received from the battery. The cell state can be defined and monitored using the variables defined in Table 1, where subscript k denotes a time step.

TABLE 1

| Variable | Definition (units) |
| --- | --- |
| $V_{pred,k}$ | Predicted cell potential (volts (V)) |
| $V_{actual,k}$ (or $V_k$) | Measured cell potential (V) |
| $V_p$ | Cell polarization (V) |
| $C_0$ | Cell maximum charge capacity (ampere hours (Ah)) - configuration parameter |
| $SOC_k$ | Cell state of charge (fraction of $C_0$) |
| $U_k$ | Maximum energy cell can discharge from present SOC at reference temperature $T_{ref}$ |
| $Q_{discharge,k}$ | Amount of charge transferred as of time step k. Sign convention can be used, e.g., $Q_{discharge,k} > 0$ indicates discharging; $Q_{discharge,k} < 0$ indicates charging. |
| $I_k$ | Measured cell current (A) ($I_k > 0$ for discharging; $I_k < 0$ for charging) |
| $R_i$ | Cell internal resistance (ohms) - configuration parameter |
| $T_k$ | Measured cell temperature (° C.) |
| $\mu_k$ | Notational convenience indicating a cell state defined by [$V_p$, $SOC_k$] |
| dt | Time step (seconds) |

In some embodiments, using the notation of Table 1, a cell state model update function is defined such that:

$$[\mu_k, V_{pred,k}] = \text{modelUpdate}(\mu_{k-1}, I_k, C_0, R_i, T_k, dt). \quad (1)$$

The modelUpdate( ) function calculates the cell's SOC and predicted potential for time step k based on the previous cell state, measured current and temperature, estimated values of charge capacity $C_0$ and internal resistance $R_i$, and time step. The modelUpdate( ) function can be based on conventional models of cell behavior using an equivalent cell circuit model. Examples of such models are known in the art, and an appropriate model can be selected based on the particular type of cell.

The time step dt may be chosen based on the current operating state of the cell. For example, the cell can have finite state model that includes the following states: "Discharging" (current is being drawn from the battery); "Charging" (current is being applied to recharge the battery); "Relaxing" (current out of (or into) the battery is below a threshold indicating inactivity); and "Idle" (entered from the Relaxing state when the current remains below the inactivity threshold and the voltage remains stable over an extended period of time, e.g., at least 15 minutes). In some embodiments, process 400 can update the battery state at a higher rate (e.g., dt~1 s) when in the Discharging, Charging, or Relaxing state and at a lower rate (e.g., dt~900 s) when in the Idle state. Other state models can also be used.

In some embodiments, the equivalent cell circuit model depends on state of health parameters such as charge capacity $C_0$ and internal resistance $R_i$. It is expected that these parameters will degrade over time as the cell ages, with maximum charge capacity slowly decreasing and internal resistance slowly increasing. In some embodiments, the battery monitoring system can estimate $C_0$ and $R_i$ can using a passive-real time process based on cell sensor data; examples of such processes are described below. In other embodiments, $C_0$ and $R_i$ can be measured from time to time (e.g., by performing a testing procedure when the battery is expected to be idle for an extended period of time) and treated as constants between measurements.

Process 400 can begin with initialization at block 402. Initialization can occur, for instance, when the battery management system is powered on or reset, or when the battery transitions from Idle state to any other state. Initialization can include establishing initial values of various parameters of a cell state model, on the assumption that the cell is not in use when initialization occurs. For example, $V_p$ can be initialized to zero. $C_0$ and $R_i$ can be initialized based on the last measured or estimated values. $SOC_0$ can be initialized to the last estimated SOC, or, if the battery is not polarized during initialization, $SOC_0$ can be calculated from measurements of $V_{actual,0}$ and $T_0$ using a getSOC(V, T) function that computes cell state of charge as a function of cell potential and temperature based on an equivalent cell circuit model. In some embodiments, getSOC( ) can be computed in advance for a discrete set of potential and temperature values and stored in a lookup table to facilitate real-time computation. Other parameters and flags can also be initialized. For instance $Q_{discharge,0}$ can be initialized to 0.

At block 404, for each iteration of process 400 (at time step k), new values of state parameters for the cell are determined. In some embodiments, determining new state parameters can include measuring the current being drawn ($I_k$), the actual potential across the cell ($V_{actual,k}$), and cell temperature ($T_k$) and applying Eq. (1) to determine $SOC_k$ and predicted potentials $V_p$ and $V_{pred,k}$.

In some embodiments, determining new state parameters can also include estimating cell energy ($U_k$) and cell discharge $Q_{discharge,k}$. For example, the following equations can be used:

$$U_k = \int_0^{C_k} \text{getOCV}\left(\frac{C}{C_0}, T_{ref}\right) dC, \quad (2)$$

$$Q_{discharge,k} = Q_{discharge,k-1} + I_k dt, \quad (3)$$

where getOCV(SOC, T) in Eq. (2) is a function complementary to getSOC(V, T) that computes cell potential (specifically the open circuit voltage) as a function of SOC and cell temperature based on an equivalent cell circuit model. Similarly to the getSOC( ) function, getOCV( ) can be computed in advance for a discrete set of SOC and temperature values and stored in a lookup table to facilitate real-time computation. It should be understood that $U_k$ can be computed at each iteration, approximating the integral as a series of time steps.

At block 406, the state parameters determined at block 404 are used to compute a set of "optimistic" cell parameters and a set of "pessimistic" cell parameters, in particular an optimistic cell potential ($V_{opt}$) and a pessimistic cell potential ($V_{pess}$) The optimistic cell parameters represent state parameters for a hypothetical cell with increased charge capacity and decreased internal resistance (relative to the current estimates of $C_0$ and $R_i$) that undergoes the same charge or discharge event as the cell being modeled. Conversely, the pessimistic cell parameters represent state parameters for a hypothetical cell with decreased charge capacity and increased internal resistance (again, relative to the current estimates of $C_0$ and $R_i$) that undergoes the same charge or discharge event as the cell being modeled. In some embodiments, the optimistic and pessimistic cell parameters are not defined as a fixed error margin around the state parameters determined at block 404; instead they are computed dynamically using a cell state model.

By way of illustration, in some embodiments, an optimistic cell potential $V_{opt}$ is defined on the following assumptions: the cell's maximum charge capacity $C_0$ is underestimated by an amount $K_{C0,opt}$; the cell's internal resistance $R_i$ is overestimated by an amount $K_{Ri,opt}$; and the cell's overpotential is off by a scaling factor of $K_{\eta,opt}$. On this assumption, the following computations can be used to determine $V_{opt}$:

$$C_{0,opt} = C_0 + K_{C0,opt}, \quad (4)$$

$$C_{init,opt} = C_{0,opt} SOC_0, \quad (5)$$

$$C_{opt,k} = C_{init,opt} - Q_{discharge,k}, \quad (6)$$

$$SOC_{opt,k} = \frac{C_{opt,k}}{C_{0,opt}}, \quad (7)$$

$$\eta_{ec,opt} = K_{\eta,opt}(V_c + V_e), \quad (8)$$

$$R_{i,opt,k} = (R_i - K_{Ri,opt})\exp(-E_{Ro}(T_k - T_{ref})), \quad (9)$$

$$V_{opt,k} = getOCV(SOC_{opt,k}, T_k) - \eta_{ec,opt} - I_k R_{i,opt,k}, \quad (10)$$

where $E_{Ro}$ is the activation energy. The K factors can be chosen as desired, e.g., based on empirical observations of cell-to-cell variability from design specifications for well-behaved cells. In some embodiments for a battery bank of the kind described above with reference to FIG. 2, $K_{C0,opt}$ ~0.1Ah (e.g., 0.2 Ah), $K_{Ri,opt}$~0.0001Ω(e.g., 0.0003Ω), and $K_{\eta,opt}$~0.7 (e.g., 0.75).

Similarly, in some embodiments, a pessimistic cell potential $V_{pess}$ is defined on the following assumptions: the cell's maximum charge capacity $C_0$ is overestimated by an amount $K_{C0,pess}$; the cell's internal resistance $R_i$ is underestimated by an amount $K_{Ri,pess}$; and the cell's overpotential is off by a scaling factor of $K_{\eta,pess}$. On this assumption, the following computations can be used to determine $V_{pess}$:

$$CF + \begin{cases} 1, & I \geq 0 \\ K_{charge}, & I < 0 \end{cases}, \quad (11)$$

$$C_{0,pess} = C_0 + K_{C0,pess}, \quad (12)$$

$$C_{init,pess} = C_{0,pess} SOC_0, \quad (13)$$

$$C_{pess,k} = C_{init,pess} - Q_{discharge,k}, \quad (14)$$

$$SOC_{pess,k} = \frac{C_{pess,k}}{C_{0,pess}}, \quad (15)$$

$$\eta_{ec,pess} = K_{\eta,pess}(V_c + V_e), \quad (16)$$

$$R_{i,pess,k} = (R_i + K_{Ri,pess})\exp(-E_{Ro}(T_k - T_{ref})), \quad (17)$$

$$V_{pess,k} = getOCV(SOC_{pess,k}, T_k) - CF * (\eta_{ec,pess} - I_k R_{i,pess,k}). \quad (18)$$

Similarly to the optimistic cell, the K factors for the pessimistic cell can be chosen as desired, based on empirical observations of cell parameters (and variability thereof) and/or based on specific changes that would indicate an electrical failure. In some embodiments for a battery bank of the kind described above with reference to FIG. 2, $K_{C0,pess}$~-0.1 Ah (e.g., 0.2 Ah), $K_{Ri,pess}$~0.0003Ω(e.g., 0.0001Ω)and $K_{\eta,pess}$ ~0.7 (e.g., 0.75). In Eqs. (11) and (18), CF is a scaling factor that is applied to the total overpotential of the cell when the cell is charging, accounting for increased variability in cell potential while charging. (As will become apparent, applying a scaling factor only to the pessimistic potential estimate—or only to the optimistic potential estimate—has the effect of widening an envelope of acceptable potentials when the cell is charging.)

It should be noted that the labels "optimistic" and "pessimistic" are not intended to imply that $V_{opt,k} > V_{pess,k}$, and this need not be the case. For instance, Eqs. (4)-(10) and (11)-(18) yield the result that $V_{opt,k} > V_{pess,k}$ when the cell is discharging, but when the cell is charging, $V_{pess,k} > V_{opt,k}$. In some embodiments, to ensure that the envelope has at least a minimum width, a padding potential $V_{pad}$ can be used to fine-tune $V_{opt,k}$ and $V_{pess,k}$. For example, if $V_{opt,k} > V_{pess,k}$, then the following equations can be used for fine-tuning:

$$V_{opt,k} = V_{opt,k} + V_{pad}, \quad (19)$$

$$V_{pess,k} = V_{pess,k} - V_{pad}. \quad (20)$$

Similarly, if $V_{pess,k} \geq V_{opt,k}$, then the following equations can be used for fine-tuning:

$$V_{opt,k} = V_{opt,k} - V_{pad}, \quad (21)$$

$$V_{pess,k} = V_{pess,k} + V_{pad}. \quad (22)$$

$V_{pad}$ can be selected as desired, e.g., $V_{pad}$=0.01 V.

At block 408, the optimistic parameters and pessimistic parameters are used to define an envelope of acceptable battery performance, such as an acceptable range of potentials. For instance, if $V_{opt,k} > V_{pess,k}$, the envelope can be defined as:

$$V_{opt,k} \geq V_k \geq V_{pess,k}, \quad (23)$$

and if $V_{pess,k} \geq V_{opt,k}$, the envelope can be defined as $$V_{pess,k} \geq V_k \geq V_{opt,k}, \quad (24)$$

where $V_k$ is the cell potential at time step k.

At block 410, the actual potential $V_{actual,k}$ across the cell is measured. In some embodiments, the measurement can be made as part of determining state parameters of the cell at block 404.

At block 412, it can be determined whether the measured potential $V_{actual,k}$ is within the envelope of acceptable battery performance, e.g., using either Eq. (23) or Eq. (24) as appropriate. In some embodiments, additional conditions may be applied. For example, the equivalent cell circuit model used to define the envelope may become unreliable if the cell $SOC_k$ is below a threshold (e.g., 0.1) or if the current $I_k$ is in excess of a threshold (e.g., 70 A for one type of cell). In conditions where the cell state model is unreliable, the envelope defined by the cell state model can be ignored (e.g., measured $V_{actual,k}$ can be treated as always being within the envelope).

A measured potential $V_{actual,k}$ that is outside the envelope may be indicative of a problem with the cell, and a model fault notification can be generated. In some embodiments, any instance of measured potential $V_{actual,k}$ being outside the envelope can result in generating a model fault notification. In other embodiments, transient excursions outside the envelope are ignored as insubstantial fluctuations; a fault counter can be used to determine when an excursion outside the envelope is considered to be substantially outside the envelope. Accordingly, at block 414, if the measured potential is not within the envelope, a fault counter can be incremented; at block 416, if the measured potential is within the envelope, the fault counter can be reset. At block 418, it is determined whether the fault counter has exceeded a threshold, and if so, a model fault notification is generated at block 420. In some embodiments, generating the model fault notification in a battery management system such as battery management system 108 of FIG. 1 can include sending the notification to control system 106 (and/or other system components as desired). In various embodiments, a model fault notification can include other actions, such as illuminating an on-battery fault indicator light, sending a message to a maintenance service to request servicing of the battery at the next opportunity, and so on.

The counter threshold for generating a model fault notification can be a constant that is defined based on tradeoffs between sensitivity (ability to detect problems) and specificity (avoiding generation of fault notifications in the absence of a real problem). In one example, the determination whether the actual cell potential is within the envelope is performed at a rate of 1 Hz and the threshold for the fault counter is set at 30, so that a model fault event is generated if the actual potential remains outside the envelope for 30 seconds or longer. Other thresholds can also be chosen.

Figure 5:
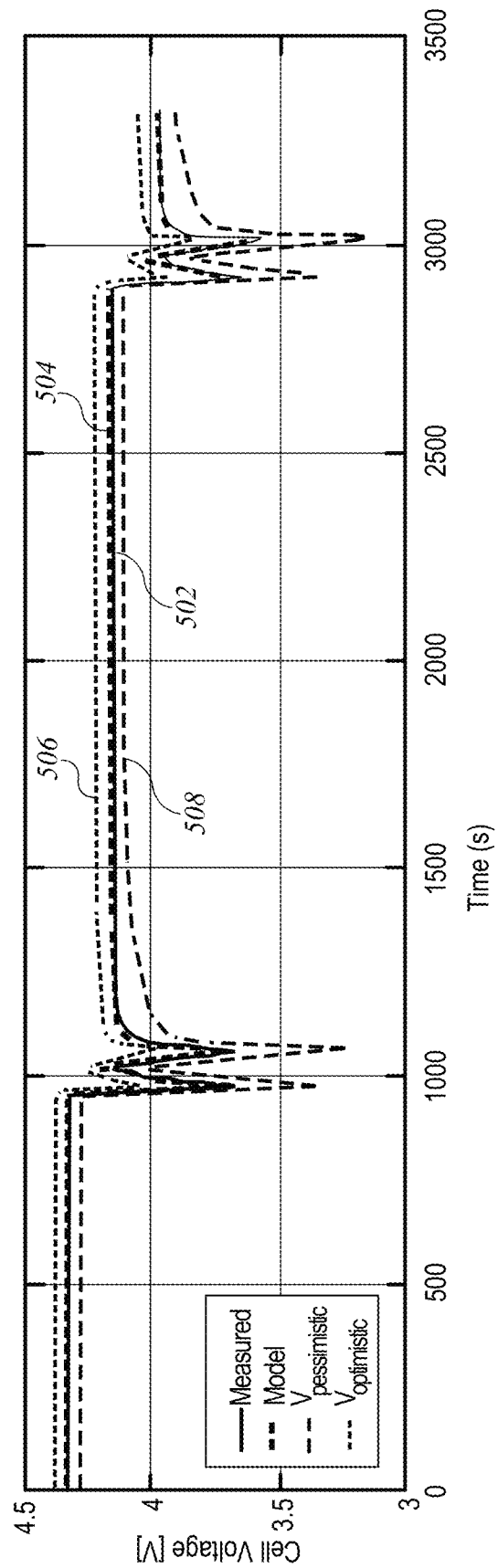
FIG. 5 shows example plots of cell potential as a function of time for a battery cell used to power an aircraft according to some embodiments.

To further illustrate the operation of process 400, FIG. 5 shows example plots of cell potential as a function of time for a battery cell used to power an aircraft according to some embodiments. In this example, the aircraft is idle until shortly before time 1000 s, at which time the aircraft ascends to a cruising altitude and begins to cruise. Shortly before time 3000 s, the aircraft descends. Solid line 502 corresponds to measured cell potential $V_{actual,k}$. Line 504 corresponds to the predicted potential $V_{pred,k}$ predicted using a cell state model applied to actual cell parameters. (In this example, line 504 closely tracks the measured potential.)

Line 506 corresponds to a predicted potential $V_{opt,k}$ predicted using optimistic cell parameters as described above (with the same cell state model as line 504), and line 508 corresponds to a predicted potential $V_{pess,k}$ predicted using pessimistic cell parameters as described above (again with the same cell state model as line 504). As can be seen, the width of the envelope defined by lines 506, 508 varies as a function of time. The width is affected by current cell behavior (e.g., how much current is being drawn) as well as hysteresis. In this example, the actual potential (line 502) remains within the envelope defined by lines 506, 508 or the duration measured, so no model fault event would be generated.

It will be appreciated that process 400 is illustrative and that variations and modifications are possible. To the extent that logic permits, operations described as sequential can be executed in parallel, or operations can be executed in a different order. Other operations not specifically described can be performed, and operations specifically described can be omitted if desired. The cell state model and other parameter values (e.g., parameters for determining optimistic and pessimistic potentials) can be optimized for a particular implementation based on the type and properties of the battery cell and on the particular sensitivity and specificity desired. The monitoring process can be performed for any number of cells in parallel or sequentially. Monitoring using process 400 or similar processes can be performed while the battery is in any state Alternatively, if desired, monitoring can be performed only while in certain states (e.g., only during discharge events or only during charge events).

Cell State of Health Estimation

As described above, model fault detection relates to detecting anomalous behavior of a battery or cell during active use. Apart from any anomalies, overall performance of a battery or battery cell (particularly a rechargeable battery or cell) can be expected to degrade slowly over time due to electrochemistry and thermodynamics, until the battery or cell reaches a point of uselessness. Accordingly, in addition to or instead of detecting anomalous behavior, some embodiments of a battery monitoring system can also monitor the "state of health" of a battery or individual cells of a multi-cell battery. In examples herein, state of health is characterized by the maximum charge capacity $C_0$ of the cell and the internal resistance $R_i$ of the cell. As a cell degrades, maximum charge capacity tends to decrease while internal resistance tends to increase. In other embodiments, other parameters may be associated with state of health, in addition to or instead of $C_0$ and $R_i$.

In some systems, monitoring of $C_0$ and $R_i$ can be part of an active testing process that is performed while the battery is otherwise idle and connected to a charger or a load. Examples of such active testing processes are known in the art. However, active testing processes typically require that the battery remain idle and connected to the charger or load for an extended period of time (which can be several hours). For batteries operating at a high duty cycle, an alternative process may be preferred.

Accordingly, some embodiments of a battery monitoring system can use a "passive" process to monitor $C_0$ and $R_i$ of a cell. The passive process relies on real-time monitoring of voltage, current, and temperature (the same state parameters that are measured during model fault detection processes described above), and $C_0$ and $R_i$ can be quantitatively estimated from the measured parameters. In some embodiments, estimating $C_0$ and $R_i$ can also include using a filtering function (e.g., a moving average) to smooth out fluctuations in the estimate. The process is referred to as "passive" because it can be performed while the battery is in use, without affecting performance of the battery. Examples of passive processes for estimating $C_0$ and $R_i$ will now be described.

In examples described herein, $C_0$ is defined as the maximum amount of charge a cell can discharge at a reference current (e.g., 1 A) and reference temperature (e.g., $T_{ref}=25°$ C.). In some embodiments, a raw charge capacity value $C_{0,raw}$ can be computed at the end of a discharge event if the discharge event satisfies certain criteria related to reliability and stability of the $C_0$ estimate. For instance, $C_{0,raw}$ for a discharge event can be defined as:

$$C_{0,raw} = \frac{Q_{discharge}}{\Delta SOC}, \qquad (25)$$

where $Q_{discharge}$ is the total charge discharged by the cell during the discharge event and $\Delta SOC$ is the change in the cell's state of charge during the discharge event. The raw value of Eq. (25) can be filtered (e.g., using a moving average or other filter function) to provide an estimate of $C_0$.

Figure 6:
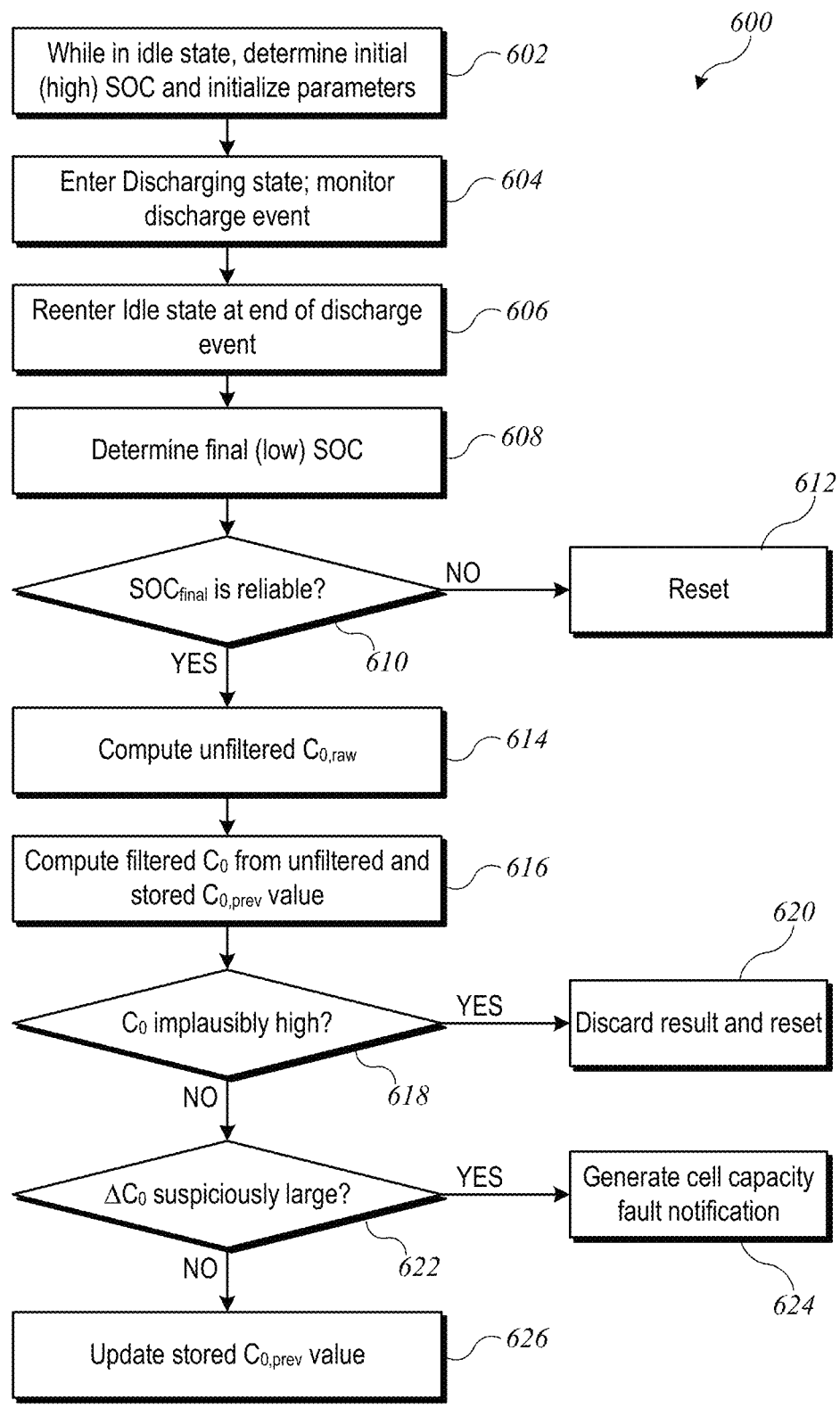
FIG. 6 is a flow diagram of a process for estimating charge capacity of a cell based on discharge events according to some embodiments.

FIG. 6 is a flow diagram of a process 600 for estimating $C_0$ of a cell based on discharge events according to some embodiments. Process 600 can be implemented, e.g., in battery monitoring system 300 or other battery monitoring systems described above. Process 600 can perform $C_0$ estimation while the battery is in an Idle state. Process 600 is an example of a passive monitoring process, as it involves no battery activity other than normal operations (i.e., powering a load and/or charging).

Process 600 can begin while the battery is in an idle state. At block 602, process 600 can determine an initial SOC ($SOC_{init}$) for the cell. In some embodiments, the initial SOC can be computed as:

$$SOC_{init} = getSOC(V_h, T_h) \qquad (26)$$

where $V_h$ is the measured cell potential at the initialization time, $T_h$ is the measured temperature at the initialization time, and getSOC( ) is the same function described above with reference to FIG. 4.

In some embodiments, $SOC_{init}$ is only established if the cell potential $V_h$ and temperature $T_h$ are within certain ranges. The ranges can be selected based on the range of potentials and temperatures for which the getSOC( ) function is a reliable model of cell behavior. If $V_h$ or $T_h$ is outside the appropriate range, then $SOC_{init}$ is not established.

In addition to establishing $SOC_{init}$, processing at block 602 can also include initializing other parameters used for $C_0$ monitoring. For instance, a running total of charge discharged by the cell ($Q_{discharge,k}$ as defined above) can be initialized to zero, and a runtime parameter $t_{run,C0}$) associated with $C_0$ monitoring can also be reset to zero.

At block 604, the battery enters a Discharging state, and process 600 can monitor the discharge event. (Where process 400 is also implemented, this monitoring can occur as part of the determination of state parameters at block 404.) For instance, the total charge discharged $Q_{discharge,k}$ can be updated at each time step (e.g., once per second) according to Eq. (3) above, and runtime parameter $t_{run,C0}$ can be incremented at each time step. At block 606, the discharge event ends and the battery reenters the Idle state (at which point updating of $Q_{discharge,k}$ and runtime parameter $t_{run,C0}$ can cease).

At block 608, process 600 can establish a final SOC ($SOC_{final}$) for the cell. In some embodiments, the final SOC can be computed as:

$$SOC_{final} = getSOC(V_l, T_l), \quad (27)$$

where $V_l$ is the measured cell potential at the end of the discharge event and $T_l$ is the measured temperature at the end of the discharge event. The results of Eqs. (26) and (27) will generally be different from each other because the after-discharge measurements of $V_l$ and/or $T_l$ generally differ from the pre-discharge measurements of $V_h$ and $T_h$.

At block 610, process 600 can determine whether all measurements are within ranges such that $SOC_{final}$ can be considered reliable. For example, in some embodiments, $SOC_{final}$ is only established if the cell potential $V_l$ and temperature $T_l$ are within certain ranges. The ranges can be selected based on the range of potentials and temperatures for which the getSOC( ) function is a reliable model of cell behavior. If $V_l$ or $T_l$ is outside the appropriate range, then $SOC_{final}$ is not established; instead, the calculation can be reset at block 612, and process 600 can return to block 602 to start over.

Other requirements related to reliability of $SOC_{final}$ can also be applied. For instance, in some embodiments if the runtime parameter $t_{run,C0}$ exceeds an upper limit, the result may become unreliable (e.g., due to $Q_{discharge,k}$ integrating a current sensor offset error), and process 600 can rest at block 612 and return to block 602 to start over.

As another example, block 610 can require that the change in SOC, defined as $$\Delta SOC = |SOC_{init} - SOC_{final}|, \quad (28)$$

exceeds a minimum threshold for reliability. The threshold can be chosen to require that the discharge event consumed a significant fraction of the cell's charge capacity; for instance, the threshold can be 0.4 or 0.5 or the like. If not, the calculation can be reset at block 612, and process 600 can return to block 602 to start over.

At block 614, process 600 can compute an unfiltered $C_0$ value ($C_{0,raw}$) according to Eq. (25), where $Q_{discharge}$ is the final value of $Q_{discharge,k}$ from the discharge event at block 604, and $\Delta SOC$ is given by Eq. (25). At block 616, process 600 can compute a filtered $C_0$ value using an infinite impulse response filter that approximates a moving average:

$$C_{0,filt} = \gamma C_{0,raw} + (1-\gamma) C_{0,prev}, \quad (29)$$

where $C_{0,prev}$ is a stored estimate of $C_0$ (e.g., from a previous iteration of process 600) and $\gamma$ is a filter decay constant that can be chosen based on desired sensitivity to updated values. In one example, $\gamma = 0.05$; however, other values can be chosen. Other techniques for combining the newly computed $C_{0,raw}$ with previous estimates of $C_0$ can be used, including a moving average, weighted moving average (with more recent estimates being given greater weight), recursive moving average, or the like. In some embodiments, a statistical analysis of a distribution of recent estimates of $C_0$ for the cell can be performed, e.g., to determine how far outside an expected distribution the most recent $C_{0,raw}$ value is, allowing random measurement noise to be smoothed out. In some embodiments, prior to the first iteration of process 600 for a new cell, $C_{0,prev}$ can be initialized using a charge capacity measured during testing of the cell, a nominal value (e.g., based on the design specification of the cell), or another value as desired.

At block 618, process 600 can determine whether $C_{0,filt}$ is implausibly high, e.g., by comparing $C_{0,filt}$ to a threshold. This threshold can be set to correspond to (or exceed) the maximum charge capacity the cell can be expected to have. In some embodiments, the maximum charge capacity can be determined based on the design specification of the cell, with some allowance for better-than-design performance. In other embodiments, the maximum charge capacity for a specific cell can be determined by actively measuring the charge capacity of the cell during pre-installation testing, on the assumption that the charge capacity of a cell does not increase with use. If $C_{0,filt}$ is above the threshold, then at block 620, $C_{0,filt}$ is discarded and process 600 can reset, returning to block 602. In some embodiments, an implausibly high $C_{0,filt}$ is assumed to be a numerical artifact and is simply ignored. In other embodiments, process 600 can generate a $C_0$ error notification. In still other embodiments, process 600 can track whether implausibly high $C_{0,filt}$ occurs repeatedly and generate a $C_0$ error notification where this is the case.

In some embodiments, the $C_0$ estimate $C_{0,filt}$ can be used to trigger cell capacity fault notifications. For instance, $C_0$ is expected to change slowly over time, and unexpectedly rapid changes may indicate a problem. Accordingly, at block 622, process 600 can compute a change in $C_0$, e.g., using $$\Delta C_0 = |C_{0,prev} - C_{0,filt}|, \quad (30)$$

and, if $\Delta C_0$ exceeds a threshold, the result is treated as suspicious. For instance, at block 624, process 600 can generate a "cell capacity fault" notification. In some embodiments, multiple thresholds can be defined, and different fault notifications can be generated based on which threshold(s) were exceeded. For instance, a "cell capacity suspicious" fault notification can be generated if $\Delta C_0$ exceeds a first threshold (e.g., 0.4 Ah), and a "cell capacity very suspicious" fault notification can be generated if $\Delta C_0$ exceeds a second, higher threshold (e.g., 0.8 Ah). When a cell capacity fault notification is generated at block 624, process 600 can reset, discarding the result of the $C_0$ calculation and returning to block 602.

At block 626, the stored $C_{0,prev}$ value can be updated, e.g., by replacing the stored value with $C_{0,filt}$ computed at block 616. The updated $C_{0,prev}$ value can be reported to control system 106 or other system components. In some embodiments, control system 106 can incorporate the estimated charge capacity into a battery status report (e.g., for review by service technicians).

Process 600 can be repeated for every discharge event, assuming the battery enters the Idle state between discharge events. In some embodiments, whenever the battery enters the Idle state, the battery management system can determine whether a valid $SOC_{high}$ is currently stored. If not, then block 602 can be performed; if so, then block 608 and subsequent blocks can be performed. In some embodiments, process 600 or a similar process can also be used to estimate $C_0$ based on measurements during a charge event. (This may not be desirable, e.g., if the battery system design is such that measurements of current or other relevant parameters are less reliable during charge events than during discharge events.)

It will be appreciated that process 600 is illustrative and that variations and modifications are possible. To the extent that logic permits, operations described as sequential can be executed in parallel, or operations can be executed in a different order. Other operations not specifically described can be performed, and operations specifically described can be omitted if desired. For instance, in the examples described, the current estimate and a single value representing a previous estimate are used, but in other implementations, previous estimates from multiple iterations of process 600 can be stored, and a statistical analysis of a set of estimates can be performed. (Such statistical analysis may enhance accuracy and reduce fluctuations but would also increase the amount of memory required to store the previous estimates.) The cell state model and other parameter values in a particular implementation can be selected for optimal results based on the type and properties of battery cell and the particular sensitivity and specificity desired. The $C_0$ estimation process can be performed for any number of cells in parallel or sequentially. In some embodiments, if the estimated $C_0$ (after filtering) drops below a lower limit, a low $C_0$ fault notification can be generated; this may be an indication that the cell is due for replacement.

In some embodiments, internal resistance $R_i$ of a cell can be estimated in addition to or instead of $C_0$. Internal resistance $R_i$ can be defined as the resistance (ohmic) component of the cell's impedance at a standard SOC, current, and temperature and at no cell polarization. The ohmic component of impedance can be understood as the instantaneous change in potential with respect to current; however, instantaneous measurements of change may not be practical for an operating cell. In addition, internal resistance generally depends on SOC, temperature, and discharge current, so simply measuring $\Delta V/\Delta I$ over a short period may not yield a reliable estimate. Accordingly, some embodiments introduce compensation factors to improve the $R_i$ estimate.

Figure 7:
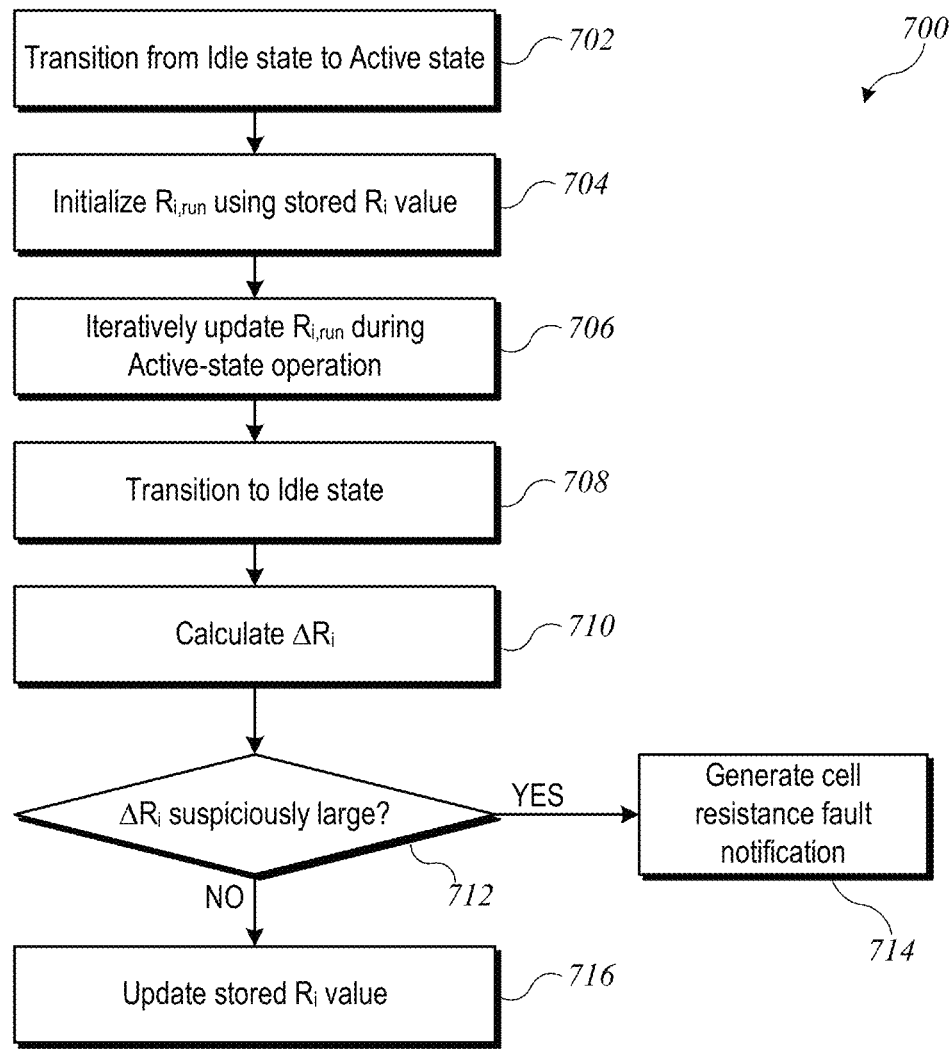
FIG. 7 is a flow diagram of a process for estimating internal resistance of a cell based on a discharge event according to some embodiments.

FIG. 7 is a flow diagram of a process 700 for estimating $R_i$ of a cell based on a discharge event according to some embodiments. Process 700 can be implemented, e.g., in battery monitoring system 300 or other battery monitoring systems described above. Process 700 can perform an iterative (running) $R_i$ computation while the battery is actively operating (e.g., in the Discharging or Charging state) and can update the $R_i$ estimate using the running computation when the battery enters Idle state. Process 700 is another example of a passive monitoring process that involves no battery activity other than normal operations.

Process 700 can begin when the battery transitions from an Idle state to an Active state (e.g., Charging or Discharging state) at block 702. In response to the transition, at block 704, process 700 can initialize a running estimate ($R_{i,run}$) of the internal resistance. For example, the running estimate can be initialized to the $R_i$ value determined from a previous execution of process 700. In some embodiments, during a first iteration of process 700 for a new cell, $R_{i,run}$ can be initialized based on an internal resistance measured during testing of the cell, a nominal value (e.g., based on the design specification of the cell), or another value as desired.

Figure 8:
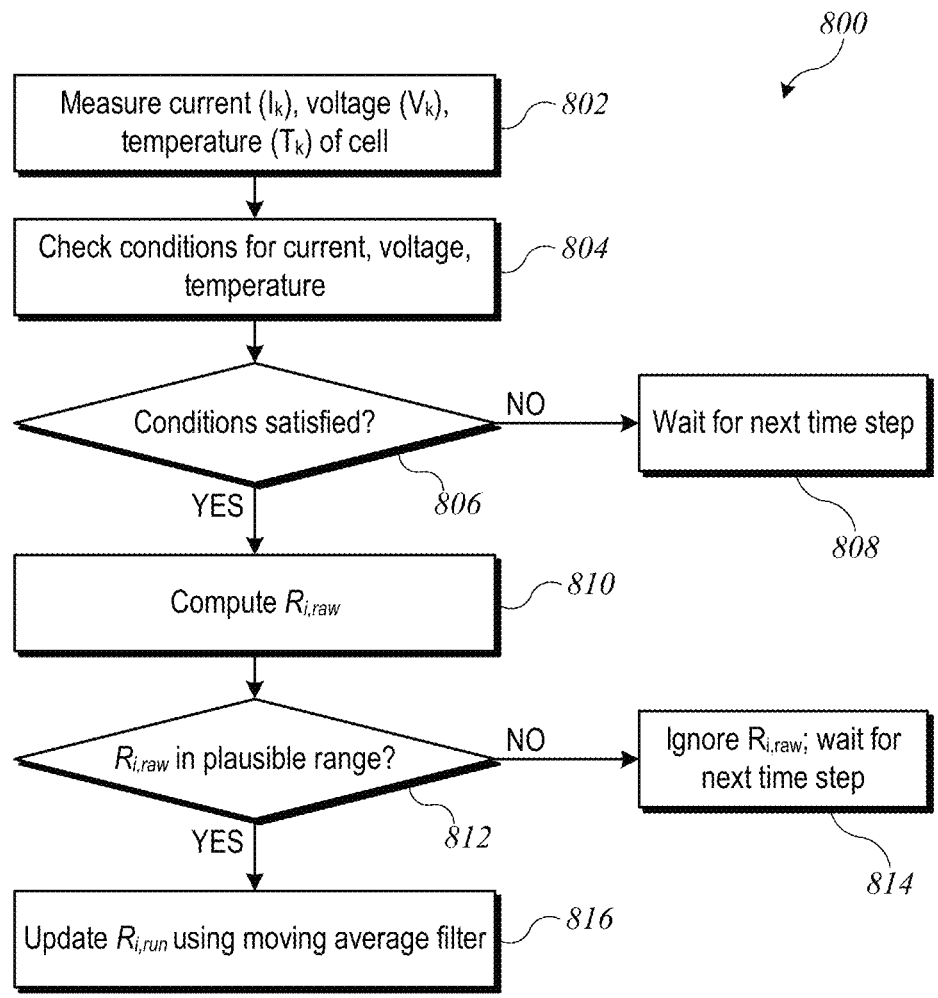
FIG. 8 shows a flow diagram of a process for iteratively updating a running estimate of internal resistance according to some embodiments.

At block 706, for as long as the battery remains in the Active state, $R_{i,run}$ is iteratively updated. (Where process 400 is also implemented, this updating can occur as part of the determination of state parameters at block 404.) FIG. 8 shows a flow diagram of a process 800 for iteratively updating $R_{i,run}$ according to some embodiments. Process 800 can be used, e.g., to implement block 704 of process 700, and process 800 can be performed at regular time intervals (time index k) while the battery is in Active state.

At block 802, process 800 can measure the current ($I_k$), potential ($V_k$), and temperature ($T_k$) of the cell. At block 804, process 800 can check whether reliability conditions on current, potential and temperature are satisfied. For example, the following reliability conditions can be applied:

$$|I_k - I_{k-1}| > \Delta I_{min}, \quad (31)$$

$$|V_k - V_{k-1}| > \Delta V_{min}, \quad (32)$$

$$T_{max} \geq \text{mean}(T_k, T_{k-1}) \geq T_{min}. \quad (33)$$

Eqs. (31) and (32) require that the changes in potential and current from one time step to the next be large enough to measure. Eq. (33) requires that the temperature be in a range where the models of resistive behavior used to update $R_{i,run}$ are considered reliable. The limiting parameters $\Delta I_{min}$, $\Delta V_{min}$, $T_{max}$, and $T_{min}$ can be chosen as desired for a particular system. In one example using an implementation of battery bank 200 of FIG. 2, $\Delta I_{min}$=2 A, $\Delta V_{min}$=0.010 V, $T_{max}$=50° C., and $T_{min}$=20° C. Other conditions can also be applied, e.g., upper limits on the change in current and/or potential, and limits on the change in temperature.

At block 806, if at least one of the reliability conditions of block 804 is not satisfied, process 800 can wait for the next time step at block 808 and try again. If, at block 806, all reliability conditions are satisfied, then at block 810, process 800 can compute a "raw" estimate $R_{i,raw}$ for time step k. In some embodiments, the following computation can be used:

$$R_{i,raw} = \frac{V_k - V_{k-1}}{I_k - I_{k-1}} + IRComp(SOC_k, I_k, T_k), \quad (34)$$

where $SOC_k$ can be determined using the function getSOC($V_k$, $T_k$) function describe above with reference to Eq. (26), and IRComp( ) is a function that returns an internal resistance compensation factor that depends on SOC, current, and temperature. For example, IRComp( ) can be defined as:

IRComp(SOC, I, T)=calcRI($SOC_{ref}$, $I_{ref}$, $T_{ref}$)−calcRI (SOC, I, T). (35)

The function calcRI( ) can be defined as:

calcIR(SOC,I,T)=A(SOC,I)*exp(−B(SCO,I)*(T+20)$^{1/3}$), (36)

where A( ) and B( ) are functions that can be defined empirically by testing a number of cells of a given design specification under controlled conditions. In some implementations, the empirical analysis can be used to populate a lookup table with values of A( ) and B( ) corresponding to various combinations of SOC and I. In Eq. (35), $SOC_{ref}$, $I_{refp}$, and $Tre_{ref}$ are constant reference values for SOC, current, and temperature, which can be preselected in connection with defining the functions A( ) and B( ) in Eq. (36). For example, the following reference values can be chosen: $SOC_{ref}=1$, $I_{ref}=22$ A, $T_{ref}=25°$ C.

At block 812, process 800 can determine whether $R_{i,raw}$ computed at block 810 is within a plausible range. In one example, the plausible range is defined as being between 0.005Ω and 0.03Ω); other ranges can be used, depending on the design of the cell. If $R_{i,raw}$ is not in the plausible range, then at block 814, process 800 can discard or ignore the computed $R_{i,raw}$ value and wait for the next time step to try again. In other embodiments, process 800 can generate an $R_i$ error notification. In still other embodiments, process 800 can track whether implausible $R_{i,raw}$ occurs repeatedly and generate an $R_i$ error notification where this is the case.

If $R_{i,raw}$ is in the plausible range, then at block 816, process 800 can update $R_{i,run}$ using an infinite impulse response filter that approximates a moving average:

$$R_{i,run} = \gamma R_{i,raw} + (1-\gamma) R_{i,run}, \quad (37)$$

where γ is a filter decay constant that can be chosen based on desired sensitivity to updated values. In one example, γ=0.01; however, other values can also be chosen. It should be understood that in embodiments that implement both processes 600 and 800, the decay constant for $R_i$ estimation in Eq. (37) can but need not have the same value as the decay constant for $C_0$ estimation in Eq. (29). Other techniques for combining the newly computed $R_{i,raw}$ with previous estimates of $R_i$ can be used, including a moving average, weighted moving average (with more recent estimates being given greater weight), recursive moving average, or the like. In some embodiments, a statistical analysis of a distribution of recent estimates of $R_i$ for the cell can be performed, e.g., to determine how far outside an expected distribution the most recent $R_{i,raw}$ value is, allowing random measurement noise to be smoothed out.

In some embodiments, process 800 (corresponding to block 704 of process 700) can be performed iteratively for as long as the battery remains in Active state. Referring again to FIG. 7, at block 708, the battery transitions to Idle state. After the battery enters Idle state, the final value of $R_{i,run}$ (from process 800) can be used as the new $R_i$ estimate. In some embodiments, the $R_i$ estimate can be used to trigger fault notifications. For instance, $R_i$ is expected to change slowly over time, and unexpectedly rapid changes may indicate a problem. Accordingly, at block 710, process 700 can compute a change in $R_i$, e.g., using:

$$\Delta R_i = |R_{i,run} - R_i| \quad (38)$$

where $R_i$ is the $R_i$ value from block 702. If $\Delta R_i$ exceeds a threshold, the result is treated as suspicious. For instance, at block 714, process 700 can generate a "cell resistance fault" notification. In some embodiments, multiple thresholds can be defined, and different fault notifications can be distinguished based on which threshold(s) were exceeded. For instance, a "cell resistance suspicious" fault notification can be generated if $\Delta R_i$ exceeds a first threshold (e.g., 0.002Ω), and a "cell resistance very suspicious" fault notification can be generated if $\Delta R_i$ exceeds a second, higher threshold (e.g., 0.01Ω). When a cell resistance fault notification is generated at block 714, process 700 can discard the resulting $R_{i,run}$ value and return to block 702 to await the next transition to Active state.

At block 716, the stored $R_i$ value can be updated, e.g., by replacing the stored $R_i$ value with $R_{i,run}$. The updated $R_i$ value can be reported to control system 106 or other system components. In some embodiments, control system 106 can incorporate the estimated internal resistance into a battery status report (e.g., for review by service technicians).

Process 700 can be repeated, with a new $R_{i,run}$ being computed (e.g., using process 800) every time the battery enters Active state, and $R_i$ being updated (if conditions are met) when the battery is in Idle state. In some embodiments, process 700 or a similar process can be used to estimate $R_i$ based on either a charge event or a discharge event, or if desired, process 700 may be selectively invoked only in connection with discharge events (or only in connection with charging events).

It will be appreciated that processes 700 and 800 are illustrative and that variations and modifications are possible. To the extent that logic permits, operations described as sequential can be executed in parallel, or operations can be executed in a different order. Other operations not specifically described can be performed, and operations specifically described can be omitted if desired. For instance, in the examples described, the current estimate and a single value representing a previous estimate are used, but in other implementations, previous estimates from multiple iterations of process 800 can be stored, and a statistical analysis of a set of estimates can be performed. (Such statistical analysis may enhance accuracy and reduce fluctuations but would also increase the amount of memory required to store the previous estimates.) The cell state model and other parameter values in a particular implementation can be selected for optimal results based on the type and properties of battery cell and the particular sensitivity and specificity desired. The $R_i$ estimation process can be performed for any number of cells in parallel or sequentially. In some embodiments, if the estimated $R_i$ rises above an upper limit, a high $R_i$ fault notification can be generated; this may be an indication that the cell is due for replacement.

Additional Embodiments

While the invention has been described with reference to specific embodiments, those skilled in the art with access to this disclosure will appreciate that variations and modifications are possible. Battery monitoring systems and processes of the kind described herein can be used to monitor any number of batteries or any number of battery cells, and the systems and processes can be adapted to cells implemented using a variety of battery technologies. Notifications generated during battery monitoring are not limited to the examples given above, and use of notifications is not limited to the use-cases described above. Any combination of monitoring processes can be implemented in a particular system, including any one or more of the processes described above. Functions described as being based on a cell state model (e.g., equivalent cell circuit model) can be implemented by providing a lookup table keyed to the inputs of the function, with appropriate granularity based on the resolution of the measurements of cell state parameters (e.g., the resolution of the potential, current, and temperature sensors). In some embodiments, determination of monitoring parameters can be conditional on the inputs to the function being within the range covered by the lookup table.

Computational operations of the kind described herein can be implemented in computer systems that may be of generally conventional design, such as a desktop computer, laptop computer, tablet computer, mobile device (e.g., smart phone), or the like. Such systems may include one or more processors to execute program code (e.g., general-purpose microprocessors usable as a central processing unit (CPU) and/or special-purpose processors such as graphics processors (GPUs) that may provide enhanced parallel-processing capability); memory and other storage devices to store program code and data; user input devices (e.g., keyboards, pointing devices such as a mouse or touchpad, microphones); user output devices (e.g., display devices, speakers, printers); combined input/output devices (e.g., touchscreen displays); signal input/output ports; network communication interfaces (e.g., wired network interfaces such as Ethernet interfaces and/or wireless network communication interfaces such as Wi-Fi); and so on. Computer programs incorporating various features of the claimed invention may be encoded and stored on various computer readable storage media; suitable media include magnetic disk or tape, optical storage media such as compact disk (CD) or DVD (digital versatile disk), flash memory, and other non-transitory media. (It should be understood that "storage" of data is distinct from propagation of data using transitory media such as carrier waves.) Computer readable media encoded with the program code may be packaged with a compatible computer system or other electronic device, or the program code may be provided separately from electronic devices (e.g., via Internet download or as a separately packaged computer-readable storage medium).

It should be understood that all numerical values used herein are for purposes of illustration and may be varied. In some instances ranges are specified to provide a sense of scale, but numerical values outside a disclosed range are not precluded.

It should also be understood that all diagrams herein are intended as schematic. Unless specifically indicated otherwise, the drawings are not intended to imply any particular physical arrangement of the elements shown therein, or that all elements shown are necessary. Those skilled in the art with access to this disclosure will understand that elements shown in drawings or otherwise described in this disclosure can be modified or omitted and that other elements not shown or described can be added.

The above description is illustrative and is not restrictive. Many variations of the invention will become apparent to those skilled in the art upon review of the disclosure. The scope of patent protection should, therefore, be determined not with reference to the above description, but instead should be determined with reference to the following claims along with their full scope or equivalents.

What is claimed is:

1. A method for monitoring internal resistance of a battery cell, the method comprising, by an automated battery monitoring system:
   in response to detecting a transition of the battery cell from an idle state to an active state, initializing a running estimate of an internal resistance using a stored value;
   while the battery cell is in the active state:
     measuring a potential, a current, and a temperature of the battery cell; and
     iteratively updating the running estimate of the internal resistance based on the measured potential, current, and temperature, wherein iteratively updating the running estimate includes:
       determining, for each iterative update, whether the measured potential, current, and temperature are within predefined valid ranges;
       in the event that the measured potential, current, and temperature are within the predefined valid ranges, computing a raw estimate of the internal resistance based on an equivalent cell circuit model and updating the running estimate using the raw estimate and a previous running estimate from a preceding time step; and
       in the event that one or more of the measured potential, current, or temperature is not within the predefined valid ranges, waiting for the next time step without updating the running estimate;
   in response to detecting a transition of the battery cell from the active state to the idle state:
     calculating a change in internal resistance based on the stored value and a final value of the running estimate;
     generating a cell resistance fault notification in the event that the change in internal resistance exceeds a threshold value; and
     updating the stored value using the final value of the running estimate.

2. The method of claim 1 wherein updating the running estimate includes:
   applying an infinite impulse response filter to the raw estimate and the previous running estimate.

3. The method of claim 1 wherein iteratively updating the running estimate of the internal resistance based on the measured potential, current, and temperature further includes:
   in the event that the raw estimate is outside a plausible range of values, discarding the raw estimate without updating the running estimate.

4. The method of claim 3 wherein updating the running estimate includes:
   applying an infinite impulse response filter to the raw estimate and the previous running estimate.

5. The method of claim 1 wherein the active state is a charging state.

6. The method of claim 1 wherein the active state is a discharging state.

7. A battery monitoring system comprising:
   a battery interface to receive sensor data from a battery sensor of a battery cell;
   a control system interface to provide output data to a control system;
   a memory; and
   a processor coupled to the memory, the battery interface, and the control system, the processor configured to:
     initialize, in response to detecting a transition of the battery cell from an idle state to an active state, a running estimate of an internal resistance using a stored value;
     while the battery cell is in the active state:
       measure a potential, a current, and a temperature of the battery cell; and
       iteratively update the running estimate of the internal resistance based on the measured potential, current, and temperature, wherein iteratively updating the running estimate includes:
         in the event that the measured potential, current, and temperature are within predefined valid ranges: computing a raw estimate of the internal resistance based on an equivalent cell circuit model; in the event that the raw estimate is outside a plausible range of values, discarding the raw estimate; and in the event that the raw estimate is within the plausible range of values, updating the running estimate using the raw estimate and a previous running estimate from a preceding time step; and
         in the event that one or more of the measured potential, current, or temperature is not within the predefined valid ranges, waiting for the next time step without updating the running estimate;

in response to detecting a transition of the battery cell from the active state to the idle state:
calculate a change in internal resistance based on the stored value and a final value of the running estimate;
generate a cell resistance fault notification in the event that the change in internal resistance exceeds a threshold value; and
update the stored value using the final value of the running estimate.

8. The battery monitoring system of claim 7 wherein the processor is further configured such that updating the running estimate includes:
applying an infinite impulse response filter to the raw estimate and the previous running estimate.

9. The battery monitoring system of claim 7 wherein the active state is a charging state.

10. The battery monitoring system of claim 7 wherein the active state is a discharging state.

11. A computer-readable storage medium having stored therein program instructions that, when executed by a processor in a battery monitoring system coupled to a battery cell, cause the processor to execute a method comprising:
in response to detecting a transition of the battery cell from an idle state to an active state, initializing a running estimate of an internal resistance using a stored value;
while the battery cell is in the active state:
measuring a potential, a current, and a temperature of the battery cell; and
iteratively updating the running estimate of the internal resistance based on the measured potential, current, and temperature, wherein iteratively updating the running estimate includes:
determining, for each iterative update, whether the measured potential, current, and temperature are within predefined valid ranges;
in the event that the measured potential, current, and temperature are within the predefined valid ranges, computing a raw estimate of the internal resistance based on an equivalent cell circuit model and updating the running estimate using the raw estimate and a previous running estimate from a preceding time step; and
in the event that one or more of the measured potential, current, or temperature is not within the predefined valid ranges, waiting for the next time step without updating the running estimate;
in response to detecting a transition of the battery cell from the active state to the idle state:
calculating a change in internal resistance based on the stored value and a final value of the running estimate;
generating a cell resistance fault notification in the event that the change in internal resistance exceeds a threshold value; and
updating the stored value using the final value of the running estimate.

12. The computer-readable storage medium of claim 11 wherein updating the running estimate includes:
applying an infinite impulse response filter to the raw estimate and the previous running estimate.

13. The computer-readable storage medium of claim 11 wherein the active state is a charging state.

14. The computer-readable storage medium of claim 11 wherein the active state is a discharging state.

* * * * *